United States Patent [19]
Saito et al.

[11] 4,134,536
[45] Jan. 16, 1979

[54] ELECTRONIC DATA PROCESSING EQUIPMENT

[75] Inventors: Seiji Saito, Yokohama; Ichiro Sado, Tokyo; Reiji Hirano, Yokohama, all of Japan

[73] Assignee: Canon Kabushiki Kaisha, Tokyo, Japan

[21] Appl. No.: 764,558

[22] Filed: Feb. 1, 1977

[30] Foreign Application Priority Data

| Feb. 4, 1976 | [JP] | Japan | 51-11063 |
| Feb. 4, 1976 | [JP] | Japan | 51-11064 |
| Feb. 4, 1976 | [JP] | Japan | 51-11065 |
| Feb. 4, 1976 | [JP] | Japan | 51-11066 |
| Feb. 4, 1976 | [JP] | Japan | 51-11067 |
| Feb. 4, 1976 | [JP] | Japan | 51-11068 |

[51] Int. Cl.$^2$ .......................... G06F 5/00; G06F 7/48
[52] U.S. Cl. .................................. 235/310; 235/311; 364/709
[58] Field of Search ................ 235/152, 154, 155, 156

[56] References Cited
U.S. PATENT DOCUMENTS

| 3,748,450 | 7/1973 | Fico et al. | 235/155 |
| 3,816,731 | 6/1974 | Jennings et al. | 235/156 |
| 3,855,459 | 12/1974 | Hakata | 235/154 |
| 3,973,113 | 8/1976 | Goldsamt | 235/156 |

Primary Examiner—Jerry Smith
Attorney, Agent, or Firm—Fitzpatrick, Cella, Harper & Scinto

[57] ABSTRACT

Disclosed is an electronic data processing equipment for specifying and identifying the radices or units of numeric data entered and converting them into numbers in predetermined radices or units so that arithmetic operations are carried out between the numbers expressed in different radices or units. Furthermore means is provided for permitting the subtraction of a number in one radix or unit from a number in another radix or unit without the use of the functional keys.

18 Claims, 20 Drawing Figures

FIG. 3

| KEY OPERATION | DISPLAY | |
|---|---|---|
| | 0 | —(1) |
| 1 | 1 | —(2) |
| 2 | 12 | —(3) |
| H | 12 | —(4) |
| 3 | 3 | —(5) |
| 4 | 34 | —(6) |
| M | 12  34 | —(7) |
| 5 | 5 | —(8) |
| 6 | 56 | —(9) |
| S | 12  34  56 | —(10) |

FIG. 4

| KEY OPERATION | DISPLAY | |
|---|---|---|
| 1 | 1 | —(1) |
| 2 | 12 | —(2) |
| H | 12 | —(3) |
| 5 | 5 | —(4) |
| 6 | 56 | —(5) |
| S | 12  56 | —(6) |

FIG. 5

| KEY OPERATION | <DISPLAY> | |
|---|---|---|
| 5 | 5 | —(1) |
| 6 | 5 6 | —(2) |
| S | 5 6 | —(3) |
| 3 | 3 | —(4) |
| 4 | 3 4 | —(5) |
| M | 3 4 5 6 | —(6) |
| 1 | 1 | —(7) |
| 2 | 1 2 | —(8) |
| H | 1 2 3 4 5 6 | —(9) |

| KEY OPERATION | | DR | STR | F G |
|---|---|---|---|---|
| a | 1 | 1 | | φ |
| b | H | 1.00.00.00 | 3600 | 1 |
| c | 136 M | 3.16.00.00 | 11760 | 1 |
| d | 56 S | 3.16.56.00 | 11816 | 1 |

FIG. 11

| KEY OPERATION | DR | STR | FG | FSC |
|---|---:|---:|---|---|
| a  12        | 12.          | 0.       | 0 | 0 |
| b  [H]       | 12.00.00.00  | 4 320 0. | 1 | 0 |
| c  30  [M]   | 12.30.00.00  | 4 500 0. | 1 | 0 |
| d  25 5 [S]  | 12.30.25.50  | 45 025.5 | 1 | 0 |
| e  36  [M]   | 13.06.25.50  | 47 185.5 | 1 | 0 |
| f  1.23 [SC] | 1.23         | 47 185.5 | 0 | 1 |
| g  [H]       | 12.09.17.50  | 42 757.5 | 1 | φ |

FIG. 13

| KEY OPERATION | DR | STR | FG |
|---|---:|---:|---|
| a  12        | 12.          | 0.        | φ |
| b  [H]       | 12.00.00.00  | 4 3 2 00. | 1 |
| c  36 [M]    | 12.36.00.00  | 4 5 3 60. | 1 |
| d  43.56 [S] | 12.36.43.56  | 4 5403.56 | 1 |
| e  [M]       | 756.726      | 4 5403.56 | φ |

FIG. 15

| KEY OPERATION | DR | STR | FG |
|---|---:|---:|---|
| a  1         | 1           | 1      | φ |
| b  [H]       | 1.00.00.00  | 3600   | 1 |
| c  1 36 [M]  | 3.16.00.00  | 11760  | 1 |
| d  56 [S]    | 3.16.56.00  | 11816  | 1 |

FIG. 17

| KEY OPERATION | <DISPLAY> | |
|---|---|---|
| 35 | 35 | (a) |
| S | 35 | (b) |
| 5 | 5 | (c) |
| H | 50035 | (d) |

FIG. 19

| KEY OPERATION | | DR | STRS | STR | FG | FSC |
|---|---|---|---|---|---|---|
| a | 12 | 12. | 0 | 0. | 0 | 0 |
| b | H | 12.00.00.00 | 0 | 4 32 00. | 1 | 0 |
| c | 15 SC | 15 | 0 | 4 32 00 | 0 | 1 |
| d | M | 11.45.00.00 | 1 | 4 23 00 | 1 | 0 |
| e | 36 S | 11.45.36.00 | 1 | 4 23 36 | 1 | 0 |

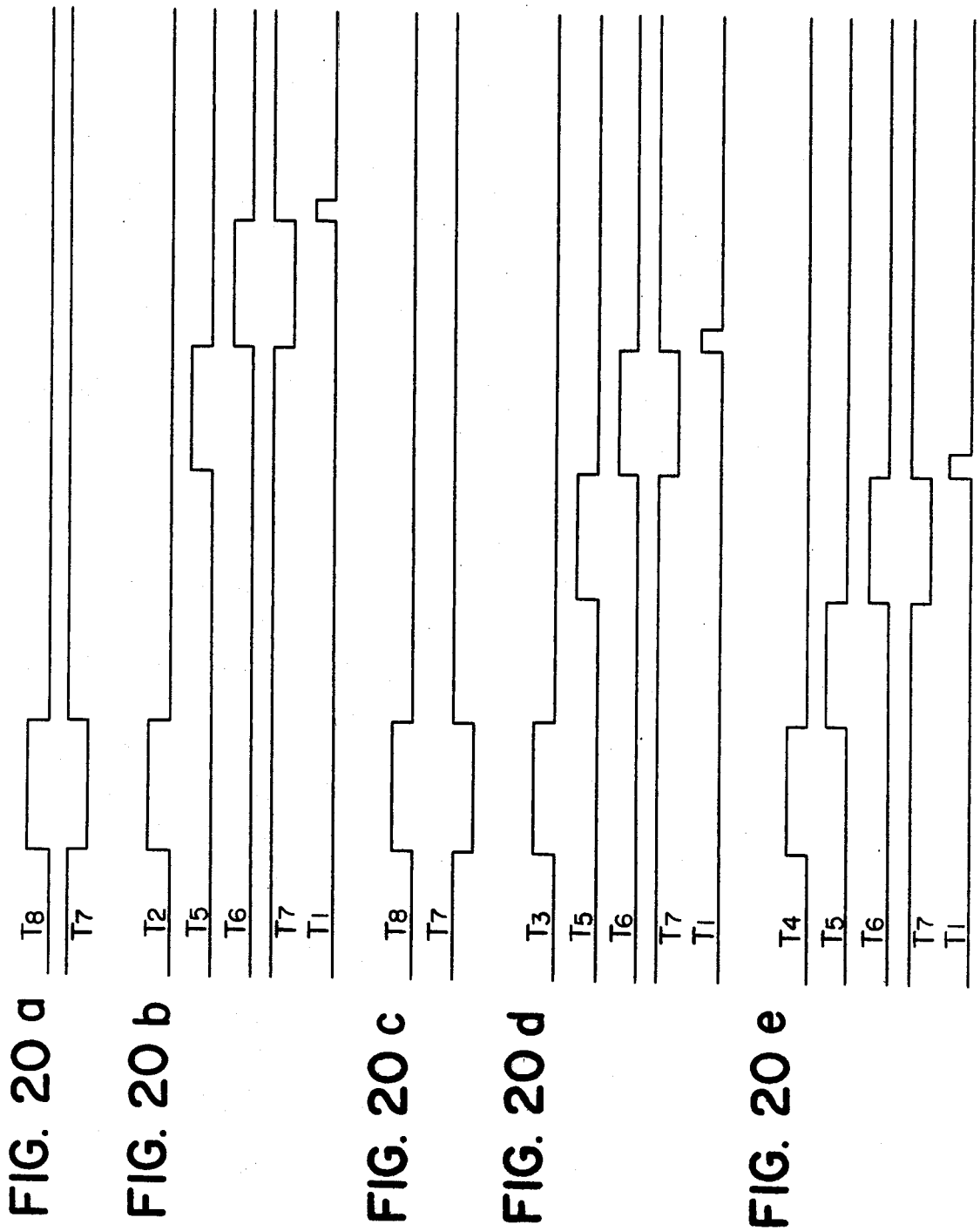

ELECTRONIC DATA PROCESSING EQUIPMENT

BACKGROUND OF THE INVENTION

1. Field of the Invention

The present invention relates to an electronic data processing equipment for processing numeric data expressed in different radices or units.

2. Description of the Prior Art

With the conventional electronic data processing equipment such as computers, numeric data expressed in various radices or units such as hour, minute and second units have been in general processed in a manner to be described below. Since the independent input of the individual numbers in hour, minute and second units is impossible, they must be entered according to a predetermined procedure and sequence. For instance, when it is desired to enter 1 hour 136 minutes and 56 seconds, one must carry out a mental conversion into 3 hours 16 minutes 56 second and then keys in in the sequence of "3", ".", "1", "6", "5", "6", "$a^{o/''}$ ", where "$a^{o/''}$ " is a key for converting a number in hour and a number in minute into a number expressed in second unit.

There has been devised and demonstrated a method for entering a number in the hexagesimal system by the combination of the decimal point key and an extra key for specifying a time unit HMS. For instance, to enter 1 hour 23 minutes 45 seconds, one keys in in the sequence of "1", ".", "2", "3", "4", "5" and "HMS". To enter 12 seconds, one must key in in the sequence of "0", ".", "0", "0", "1", "2" and "HMS". The keying-in operations are very complex and tend to result in erroneous entry.

Furthermore with the conventional electronic computers, functional keys and memory key or keys must be depressed in order to convert a number expressed in hour, second and time unit into a number expressed in second or minute unit. For instance, to convert 12 hours 30 minutes 43.56 seconds into a number in the minute unit, one must depress the keys in the order of 12 "×" 60 "=" "M+" 36 "M+" 43.56 "÷" 60 "=" "M+" "RM", where "M+" means "store in a memory register" and "RM" means "read the memory register".

Moreover, to enter a negative time data; that is, a numeric data expressed in time unit and having the negative sign, a time conversion key and functional keys must be depressed. For instance, to enter a time data "fifteen minutes to 12 hours 36 seconds"; that is, 11 hours 45 minutes 36 seconds, one must depress the keys in the order of 12.0036 "$\overrightarrow{a^{o/''}}$" "−" 0.15 "$\overrightarrow{a^{o/''}}$" "=" "$\overleftarrow{a^{o/''}}$".

Furthermore when it is desired to add 36;1 minutes to 12 hours 30 minutes 25.5 seconds and then subtracts 1.23 hours, one must depress the keys in the order of 12.30255 "$\overleftarrow{a^{o/''}}$" "+" 0.36 "$\overleftarrow{a^{o/''}}$" "−" 1.23 "=" "$\overrightarrow{a^{o/''}}$".

Thus the keying-in operations and sequences are very complex.

SUMMARY OF THE INVENTION

One of the objects of the present invention is therefore to provide an electronic data processing equipment with which even a layman may easily accomplish an arithmetic operation of time data; that is, numbers expressed in hour, minute and second with hour, minute and second unit specifying means or keys without the use of the conversion keys such as "a" and "$a^{o/''}$".

Another object of the present invention is to provide an electronic data processing equipment capable of entering a time data such as 3 hours 16 minutes 56 seconds by the depression of the keys in the sequence of "1", "H", "1", "3", "6", "M", "5", "6", "S", where "H" is a key for specifying the hour unit, "M", a key for specifying the minute unit, and "S", a key for specifying the second unit.

A further object of the present invention is to provide an electronic data processing equipment incorporating means or keys for specifying the radices or units of a numeric data entered.

For instance, when one depresses the keys in the order of 12 "H" 30 "M" 25.5 "S" 36 "M" 1.23 "SC" "H", where "SC" is a key for changing a sign, one may obtain the result of the subtraction of 1.23 hour from 12 hours 30 minutes 25.5 seconds.

A further object of the present invention is to provide an electronic data processing equipment having means for permitting the input of the past time data without the depression of the functional keys.

A further object of the present invention is to provide an electronic data processing equipment capable of the radix or unit conversion in a very simple sequence or by simple operations.

A further object of the present invention is to provide an electronic data processing equipment capable of the radix or unit conversion with the use of radix or unit specifying means. For instance, one may convert 12 hours 36 minutes 43.56 seconds into 756.726 minutes by the depression of the keys in the sequence of 12 "H" 36 "M" 43.56 "S" "M".

The above and other objects, features and advantages of the present invention will become more apparent from the following description of six preferred embodiments thereof taken in conjunction with the accompanying drawings.

BRIEF DESCRIPTION OF THE DRAWINGS

FIGS. 3, 4, 5 and 6 are views used for the explanation of the mode of operation thereof;

FIGS. 8 and 9 are views used for the explanation of the mode of operation thereof;

FIG. 11 is a view used for the explanation thereof;

FIG. 13 is a view used for the explanation of the mode of operation thereof;

FIGS. 15, 16 and 17 are views used for the explanation of the mode of operation thereof;

FIGS. 19 and 20 are views used for the explanation of the mode of operation thereof.

DESCRIPTION OF THE PREFERRED EMBODIMENT

First Embodiment, FIGS. 1-6

Figure 1:
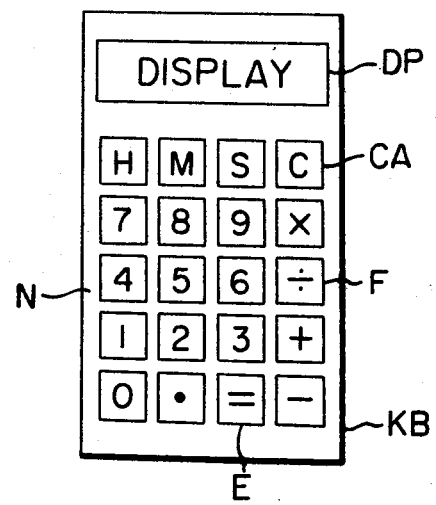
FIG. 1 is a top view of a first preferred embodiment of the present invention.

In FIG. 1 there is shown an input-output device of a first preferred embodiment of the present invention as applied to an electronic computer. It has a keyboard KB having numeral keys 0-9 including a decimal-point key (.), functional keys F, a clear key CA, an execution key or equal key E and time unit keys H, M and S for specifying or identifying hour, minute and second units.

The input-output device includes as an output unit a display unit DP consisting of well known light-emitting seven-segment elements for displaying a number entered or result of an arithmetic operation.

Figure 2:
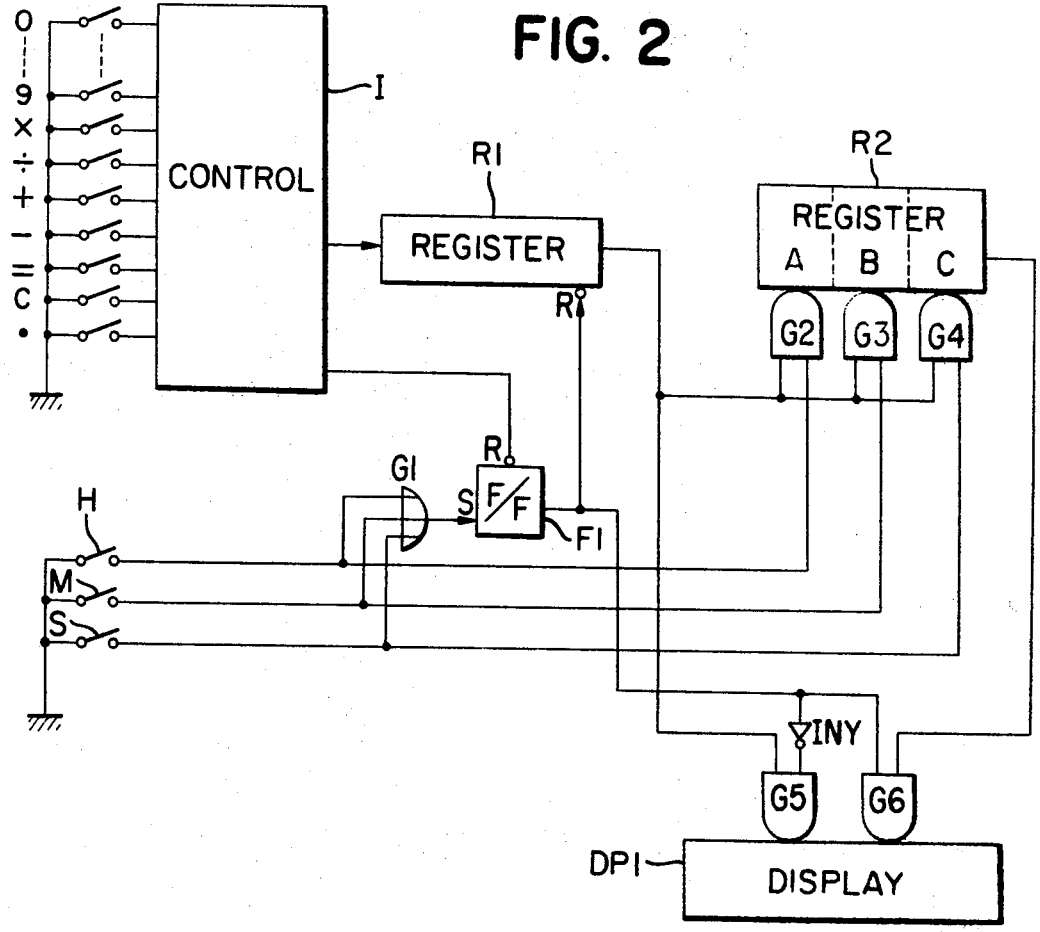
FIG. 2 is a block diagram thereof.

Referring next to FIG. 2 showing a block diagram of the first preferred embodiment, a control circuit I has not only a function of coding the output signals from the keyboard except those generated upon depression of the hour, minute and second keys H, M and S but also a function of causing the shift of the content in a register R1 as will be described in detail below. The register R1 holds the coded output from the control circuit representing the keyed-in signal, and a register R2 consists of three sections; that is, a first or HOUR section A where the content of the register R1 is transferred through AND gate G2 upon depression of the hour key H, a second or MINUTE section B to which is transferred the content of the register R1 through AND gate G3 upon depression the minute key M and a third or Second section C to which is transferred the content of the register R1 through AND gate G4.

A flip-flop F1 is set when the signal generated when either of the hour, minute and second keys H, M and S is depressed is transmitted through OR gate G1, but is reset when the keys other than the hour, minute and second keys are depressed. In response to the reset output signal from the flip-flop F1 the register R1 is reset. When the flip-flop F1 is set the content in the register R1 is transferred through AND gate G6 to the display device DP, and when the flip-flop F1 is reset, AND gate G5 is opened as the reset output signal is applied thereto through an inverter INV so that the content in the register R1 is also transferred into the display device DP.

Next referring further to FIGS. 3-6, the mode of operation of the first preferred embodiment will be described in conjunction with the input of a time data 12 H (hours) 34 M (minutes) 56 S (seconds).

First, upon depression of the numeral key "1", a signal is generated and transmitted to the control circuit I where it is converted into a coded signal which in turn is transferred into the register R1. Since the flip-flop F1 is in the "reset" state, the content in the register R1 is transferred through AND gate G5 to the display device DP and is displayed as shown at (2) in FIG. 3.

Next upon depression of the numeral key "2" in response to a control signal from the control circuit I the content "1" in the register R1 is shifted and then "2" or more specifically a coded signal representing "2" is transferred into the register R1. As a result the content changes to "12", which is displayed by the display device DP.

Upon depression of the hour key H, the content in the register R1 is transferred into the first or HOUR section A in the register R2 through AND gate G2 and then the flip-flop F1 is set so that the register R1 is cleared. The content in the register R2 is transmitted through AND gate G6 in response to the output signal from the flip-flop F1 to the display device DP and is displayed in the shifted position as shown at (4) in FIG. 4.

Upon depression of the numeral key "3", "3" is stored in the register R1 in the manner described above, and the flip-flop F1 is reset so that AND gate G6 is closed while AND gate G5 is opened. As a result, the content in the register R1 is displayed by the display device DP.

Upon depression of the numeral key "4", the register R1 has its content "3" shifted and "4" is entered so that the content changes to "34", which is also displayed as shown at (6) in FIG. 3.

Upon depression of the minute key M, the content "34" in the register R1 is transferred through AND gate G3 into the second or MINUTE section B of the register R2 in a manner substantially similar to that described above in conjunction with the depression of the hour key H. In response to the set output signal from the flip-flop F1 ihe register R1 is cleared and the content "34" in the register R2 is transmitted through AND gate G6 to the display device DP and is displayed as shown at (7) in FIG. 3.

Thereafter the numeric data "56" is entered in a manner substantially similar to that described above, and upon depression of the second key S, the content "56" in the register R1 is transferred into the third or SECOND section C in the register R2 and is displayed.

Next the entry of a time data 12 H (hours) 56 S (seconds) will be described. First the clear key CA is depressed to reset the memory in the computer to the initial state. Upon depression of the numeral keys "1" and "2", "12" is entered in the register R1 and is displayed. Upon depression of the hour key H, the content "12" in the register R1 is transferred into the first or HOUR section A in the register R2 and is displayed as shown at (3) in FIG. 4.

In like manner, "56" is stored in the register R1 and is displayed as shown at (5) in FIG. 4. Upon depression of the second key S, the content "56" in the register R1 is transferred into the third or SECOND section C in the register R2 and is displayed as shown at (6) in FIG. 4.

So far the time data has been described as being entered in the order of hour, minute and second, but it will be understood that it may be entered in any desired orders. For instance, as shown in FIG. 5, the time data may be entered in the order of second S, minute M and hour H; that is, 56 seconds 34 minutes 12 hours.

So far the numbers in hour, minute and second units have been described as, for easier reading, being displayed spaced apart from each other by a "blank" or one digit position at which no light-emitting segment is energized as shown in FIG. 3. For this purpose, "blank" digit positions or positions into which no information are stored may be previously assigned in the register R2. Alternately, the wiring between the register R2 and the display device DP may be so arranged that the numbers in hour, minute and second units may be displayed spaced apart from each other. Moreover, as shown in FIG. 6, it is possible to specify or identify the units of the numbers displayed by turning on or inserting suitable symbols such as decimal point, commas, or H, M and S in response to the depression of the corresponding hour, minute and second keys H, M and S, these unit marks being turned off in response to the depression of one of the numeral keys N. This arrangement may be easily attained by using the output from the flip-flop F1.

Furthermore, the arithmetic operations among the numbers in different units stored in the register R2 may be executed in a common unit or radix by the identification of their units based upon the prior art.

So far the present invention has been described in conjunction with the input of the time data or sexagesimal number, but it will be understood that it may be equally applied to the input of numbers in any radices or units. Some examples are shown below:

Degree, Minute and Second System:

1 degree = 60 minutes
1 minute = 60 seconds
a fraction of a second may be expressed as a decimal number in second unit.

Metric Measurements of Length:

1 meter = 100 centimeters
1 centimeter = 10 millimeters

British Measurements of Length:

1 yard = 3 feet
1 foot = 12 inches
(1 mile = 1,760 yards)

Japanese Measurements of Length:

1 ken = 6 shakus
1 shaku = 10 suns
(1 ri = 2,160 kens)

British Measurements of Weight:

1 ton = 2,240 pounds
1 pound = 16 ounces.

In summary, according to the first preferred embodiment numbers in radices different from the radix of numbers handled or executed in the electronic computer may be entered.

Figure 7:
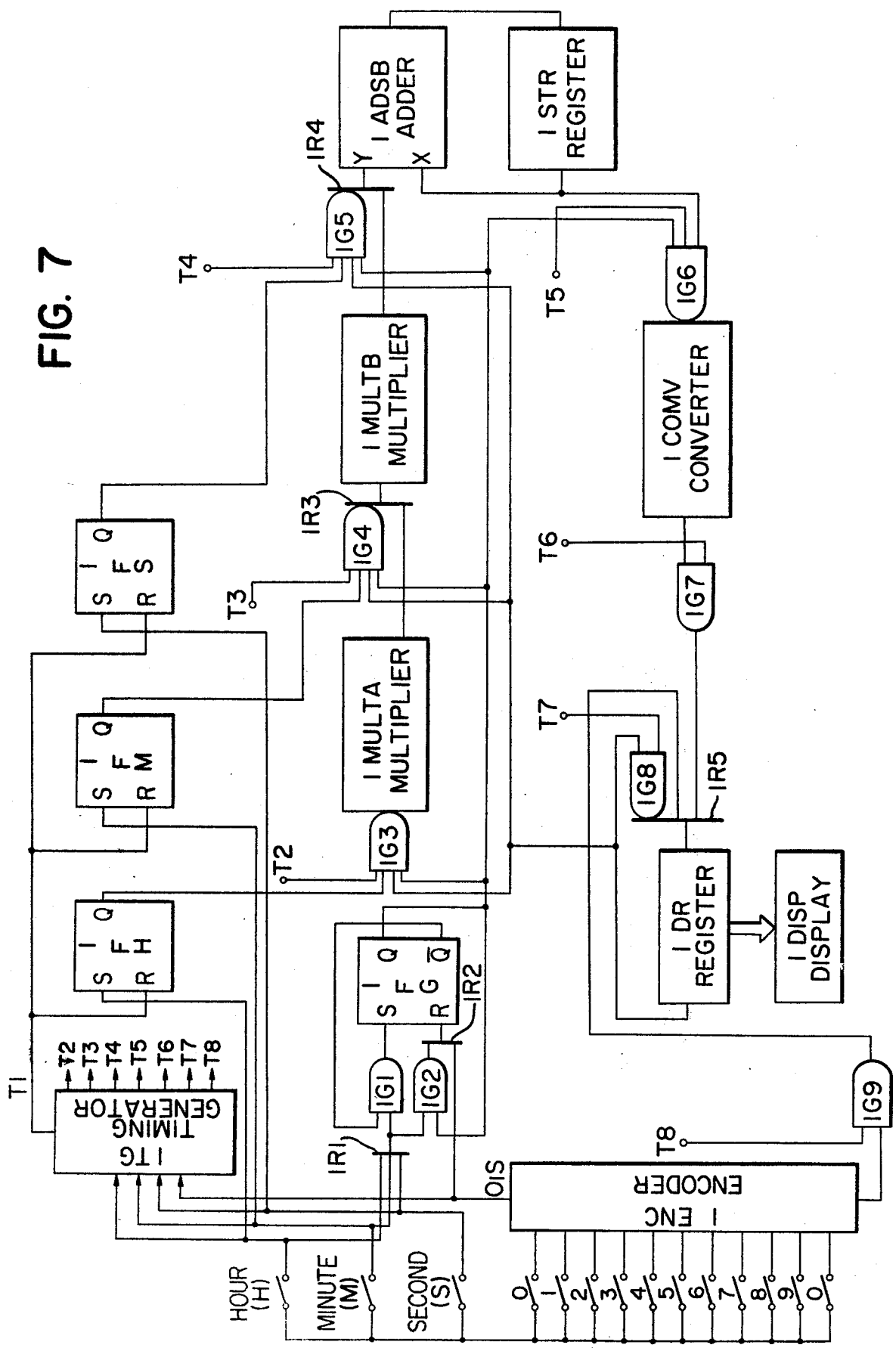
FIG. 7 is a block diagram of a second preferred embodiment of the present invention.

Second Embodiment, FIGS. 7–9

In FIG. 7 there is shown in block diagram a second preferred embodiment of the present invention having a display register 1DR, a storage register 1STR for storing a number in second (to be referred to as "Second storage register" hereinafter in this specification), a display unit 1DISP for displaying the contents in the register 1DR, a multiplier 1MULTA for multiplying the content in the register 1DR by 60 and a second multiplier 1MULTB for multiplying the content in the register 1DR or first multiplier 1MULTA by 60, the hour- and minute-weighted numbers being converted into numbers in second or second-weighted numbers by the first and second multipliers 1MULTA and 1MULTB.

The second embodiment further includes a converter 1COMU for converting a number in second stored in the storage register 1STR into a number in hour, minute and second unit, an adder 1ADSB for executing an addition or subtraction of the number in the register 1STR and the number in second stored in the register 1DR, the adder having inputs X and Y, a flip-flop 1FG for identifying that the number being displayed is in the time or hour, minute and second system, flip-flops 1FH, 1FM and 1FS for identification of the depressions of hour, minute and second keys H, M and S, respectively, AND gate G1 for setting the flip-flop 1FG in response to the depression of either of the keys H, M and S, AND gate G2 for resetting the flip-flop 1FG upon depression of either of the hour, minute or second key H, M or S, AND gate 1G3 for causing the transfer of the content in the register 1DR into the first multiplier 1MULTA at a time T2 when both the flip-flops 1FH and 1FG are set, AND gate 1G4 for causing the transfer of the content of the register 1DR into OR gate 1R3 at a time T3 when both the flip-flops 1FM and 1FG are set, AND gate 1G5 for causing the transfer of the content of the register 1DR into OR gate 1R4 at a time T4 when both the flip-flops 1FS and 1FH are set, AND gate 1G6 for causing the transfer of the register 1STR into the converter 1COMU at a time T5 when the flip-flop 1FH is set, AND gate 1G7 for causing transfer of the content in the converter 1COMU to OR gate 1R5 at a time T6, AND gate 1G8 for causing the transfer of the register 1DR to OR gate 1R5 at a time T7, AND gate 1G9 for transferring the content in encoder 1ENC to OR gate 1R5 at a time T8, OR gate 1R1 for transmitting the signal generated when either of the hour, minute or second key H, M or S is depressed to the inputs of AND gates 1G1 and 1G2, OR gate 1R2 for resetting the flip-flop 1FG when the output from either of the decoder 1DEC or AND gate 1G2 is "1", OR gate 1R3 for transmitting to the input of the second multiplier 1MULTB the output from the register 1DR derived through either of the first multiplier 1MULTA or OR gate 1R4, OR gate 1R4 for transmitting to the input Y of the adder 1ADSB the output from the register 1DR derived through either of the second multiplier 1MULTB or AND gate 1G5, OR gate 1R5 for transmitting to the register 1DR the outputs derived fro AND gates1G7, 1G8 and 1G9, the encoder 1ENC for encoding an input signal key in by the depression of a numeral key, the encoder having a signal generator for generating a one-shot signal OS in response to the depression of the numeral key, the one-shot signal OS causing the flip-flop 1FG to reset and a timing generator 1TG to generate timing signals, the timing generator 1TG also generating the timing signals T1–T8 upon depression of the keys, H, M and S and in response to the one-shot signal.

Next the mode of operation of the second preferred embodiment with the above construction will be described in conjunction with the input of a time data 1 H (hour) 1 36 M (minute) and 56 S (second) with further reference to FIGS. 8 and 9.

Upon depression of the numeral key "1", the signal OS is generated to reset the flip-flop 1FG and to cause the timing generator 1TG to generate the timing signal T8 as shown at a in FIG. 9 so that the coded signal representative of "1" is entered through AND gate 1G9 and OR gate 1R5 into the register 1DR. The contents of the registers 1DR and 1STR at this step are shown at a in FIG. 8.

Next upon depression of the hour key H, in response to the "1" output signals from the output Q of the flip-flop 1FG and OR gate 1R1 AND gate 1G1 causes the flip-flops 1FG and 1FH to set. In response to the timing signal T2 (see FIG. 9b), the content in the register 1DR is transferred to the first multiplier 1MULTA through AND gate 1G3 and is multiplied by 60. The result is transferred through OR gate 1R3 to the second multiplier 1MULTB and is multiplied again by 60. The result "3600" is applied to the input Y of the adder 1ADSB through OR gate 1R4. Since the content in the register 1STR is zero, the output "3600" from the adder 1ADSB is transferred into the register 1STR. In response to the timing signal T5 the content in the register 1STR is transferred through AND gate 1G6 to the converter 1COMU and is converted into "1", which in turn is transferred in response to the timing signal T6 to the register 1DR through AND gate 1G7 and OR gate 1R5. In response to the timing signal T1 the flip-flop 1FH is reset, and the operation is completed with the contents in the registers 1DR and 1STR as shown at b in FIG. 8.

Next upon depressions of the numeral and minute keys "1", "3", "6" and "M" in the order described, the flip-flops 1FG and 1FM are set and the contents "136" in the register 1DR is transferred through AND gate 1G4 and OR gate 1R3 to the second multiplier 1MULTB and is multiplied by 60 to "8160", which in turn is added to the content "3600" in the register 1STR. Thus the content in the register 1STR changes to "11760". In response to the timing signal T5, the content of the register 1STR is transferred to the converter 1COMU to be converted into "3 hours 16 minutes", which in turn is transferred in response to the timing signal T6 to the register 1DR through AND gate 1G7 and OR gate 1R5 and is displayed.

Next in response to the timing signal T1 the flip-flop 1FM is reset. The timing signals are shown in FIG. 9c and the contents of the registers 1DR and 1STR are shown at c in FIG. 8.

Next upon depressions of the keys in the order of "5", "6" and "S", the flip-flops 1FG and 1FS are set and the content "56" in the register 1DR is applied in response to the timing signal T4 to the Y input of the adder 1ADSB through OR gates 1R5 and 1R4 and is added to the content: "11760" in the register 1STR. The sum "11816" is accumulated in the register 1STR. Next in response to the timing signal T5, the content "11816" in the register 1STR is transferred through AND gate 1G6 to the converter 1COMU and is converted into 3 hours 16 minutes and 56 seconds, which in turn is transferred in response to the timing signal T6 to the register 1DR through AND gate 1G7 and OR gate 1R5 and is displayed. Next in response to the timing signal T1, the flip-flop 1FS is reset and the operation is completed.

Figures 9A, 9B, 9C, 9D:
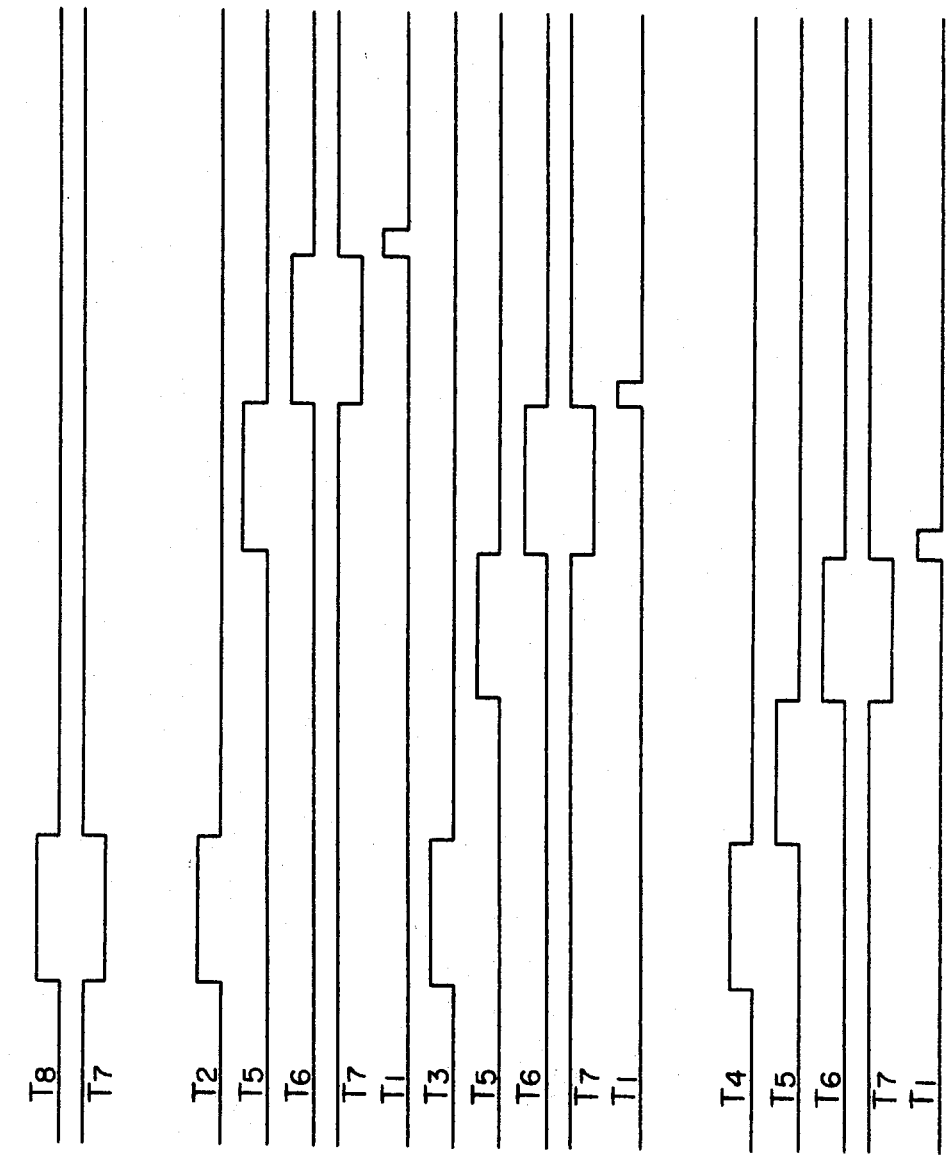

The above timing pulses are shown in FIG. 9d and the contents in the registers 1DR and 1STR are shown at d in FIG. 8.

So far the second preferred embodiment of the present invention has been described in conjunction with the input of a time data; that is, sexagesigmal number, but it will be understood that the second embodiment may be equally applied to the input of various measures of lengths and weights and systems as with the case of the first preferred embodiment.

Figure 10:
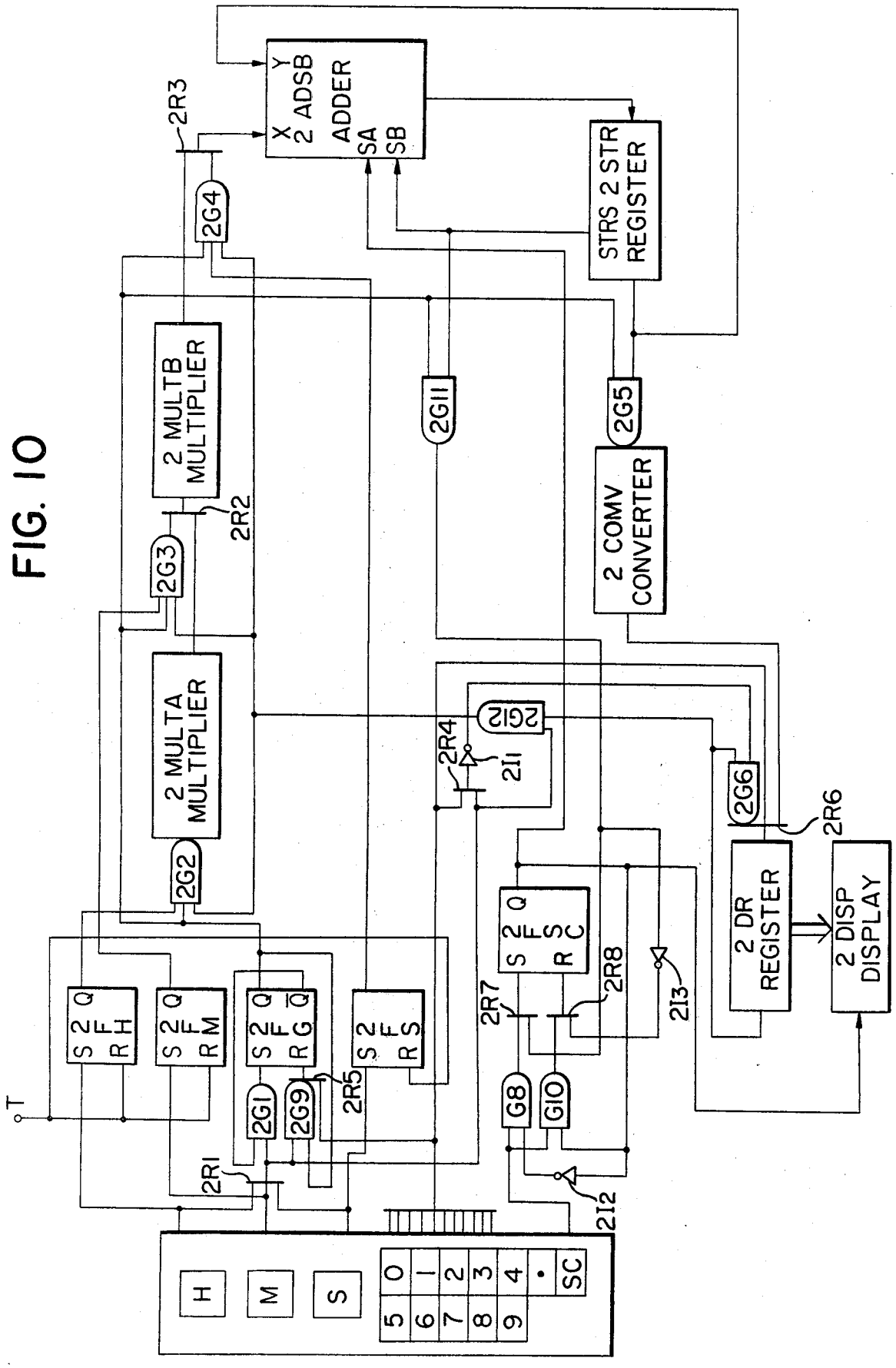
FIG. 10 is a block diagram of a third preferred embodiment of the present invention.

Third Embodiment, FIGS. 10 and 11

In FIG. 10 there is shown in block diagram a third preferred embodiment of the present invention having a keyboard including numeral keys 0–9, a decimal point key, hour, minute and second keys H, M and S and functional keys if needed.

The third embodiment further includes AND gate 2G1 for setting a flip-flop 2FG; AND gate 2G2 for transmitting the content in a register 2DR to a first multiplier 2MLTA when flip-flops 2FH and 2FG are set; AND gate 2G3 for transferring the content in the register 2DR into a second multiplier 2 MULTB when flip-flops 2FM and 2FG are set; AND gate 2G4 for transferring the content in the register 2DR to the adder 2ADSB through OR gate R3 when flip-flops 2FG and 2FS are set; AND gate 2G5 for transferring the content in a register 2STR to a converter 2 COMV when flip-flop 2FG is set; AND gate 2G6 for holding the content in the display register 2DR when no key signal is received; AND gate 2G8 for setting the flip flop 2FSC when a key SC is depressed; OR gate 2R1 for delivering an output signal upon depression of either of the hour, minute or second key H, M or S; OR gate 2R2 for transmitting the outputs from the first multiplier 2 MULTA and AND gate 2G3 to the second multiplier 2 MULTB; OR gate 2R3 for transmitting the outputs from the second multiplier 2 MULTB and AND gate 2G4 to the X input of the adder 2ADSB; OR gate 2R4 for delivering an output signal upon depression of one of the keys H, M, S, 0–9 and the decimal point key; OR gate 2R5 for resetting the flip flop 2FG when on of the numeral keys or decimal point key is depressed or when the output signal is derived from AND gate 2G9; AND gate 2G9 for reversing the state of the flip-flops 2FG in response to the depression of either of the keys H, M and S, the flip-flops 2FH, 2FM and 2FS being set upon depression of either of the keys H, M and S and being reset upon completion of the operation; the flip-flop 2FG for controlling AND gates 2G2, 2G3, 2G4, 2G5, 2G9 and 2G11; AND gate 2G10 for resetting the flip-flop 2FSC upon depression of the key SC; AND gate 2G11 for transferring the content of the register 2STR to the flip-flop 2FSC through the adder 2ADSB upon depression of either of the hour, minute or second key H, M or S, the register 2STR holding the negative sign of the sum of or difference between the contents of the registers 2DR and 2STR; OR gate 2R6 for transferring the content of the converter 2COMV to the register 2DR when one of the numeral keys or decimal point key is depressed or for entering the content in the register 2DR into itself when no numeral and decimal-point key is depressed; OR gate 2R7 for setting the flip-flop 2FSC in response to the outputs from AND gates 2G8 and 2G11; OR gate 2R8 for resetting the flip-flop 2FSC in response to the outputs from an inverter 2I3 and AND gate 2G10; the flip-flop 2FSC for indicating the negative sign of the content in the display register 2DR; the display register 2DR; a "Second" storage register 2STR; a display unit 2DISP for displaying the content in the display register 2DR; the first multiplier 2MULTA for multiplying the content in the display register 2DR by 60; the second multiplier 2MULTB for multiplying the output from the first multiplier 2MULTA or the register 2DR by 60, the first and second multipliers converting the numbers in hour and munite units into the numbers expressed in second unit; the converter 2COMV for converting the content expressed in second unit in the register 2STR into a number in hour, minute and second unit; the adder 2ADSB with inputs X and Y for executing the addition or subtraction between the contents in the registers 2STR and 2DR; input terminals SA and SB for identifying addition and subtraction; AND gate 2G12 for delivering the signal to AND gates 2G2, 2G3 and 2G4 in response to the depression of either of the keys H, M and S; and inverters 2I1, 2I2 and 2I3.

Next the mode of operation of the third preferred embodiment with the above construction will be described with further reference to FIG. 11 and in conjunction with the input of a data 12 hours 30 minutes 25.5 seconds.

Upon depression of the numeral keys "1" and "2", the flip-flop 2FG is reset in response to the output from the AND gate 2G1 and "12" is stored in the register 2DR as shown at a in FIG. 11. Next upon depression of the hour key "H", the flip-flops 2FH and 2FG are set so that the content in the register 2DR is transmitted through AND gates 2G12 and 2G2 to the first multiplier 2MULTA to the converted into a number in minute. The output from the first multiplier 2MULTA is applied through OR gate 2R2 to the second multiplier 2MULTB to be converted into a number in second unit; that is, "43200", which in turn is transmitted through OR gate 2R3 to the adder 2ADSB. Since the content in the register 2STR is zero, "43200" is stored in the register 2STR. Thereafter the content "43200" in the register 2STR is applied through AND gate 2G5 to the converter 2COMV to be converted into a number in hour; that is "12" hours, which in turn is transmitted through OR gate 2R6 to the register 2DR to be displayed by the display unit 2DISP. Thereafter in response to the timing signal T, the flip-flops 2FH, 2FM and 2FS are reset.

Next upon the depression of the keys "3", "0" and "M", the content "30" in minute in the register 2DR is converted into "1800" seconds by the second multiplier 2MULTB and is added to the content "43200" in the register 2STR. The sum "45000" in second unit is accumulated in the register 2STR and is converted by the converter 2COMV to "12 hours 30 minutes", which in turn is transferred into the display register 2DR to be displayed. Thereafter the flip-flop FM is reset in response to the timing signal T.

Figure 12:
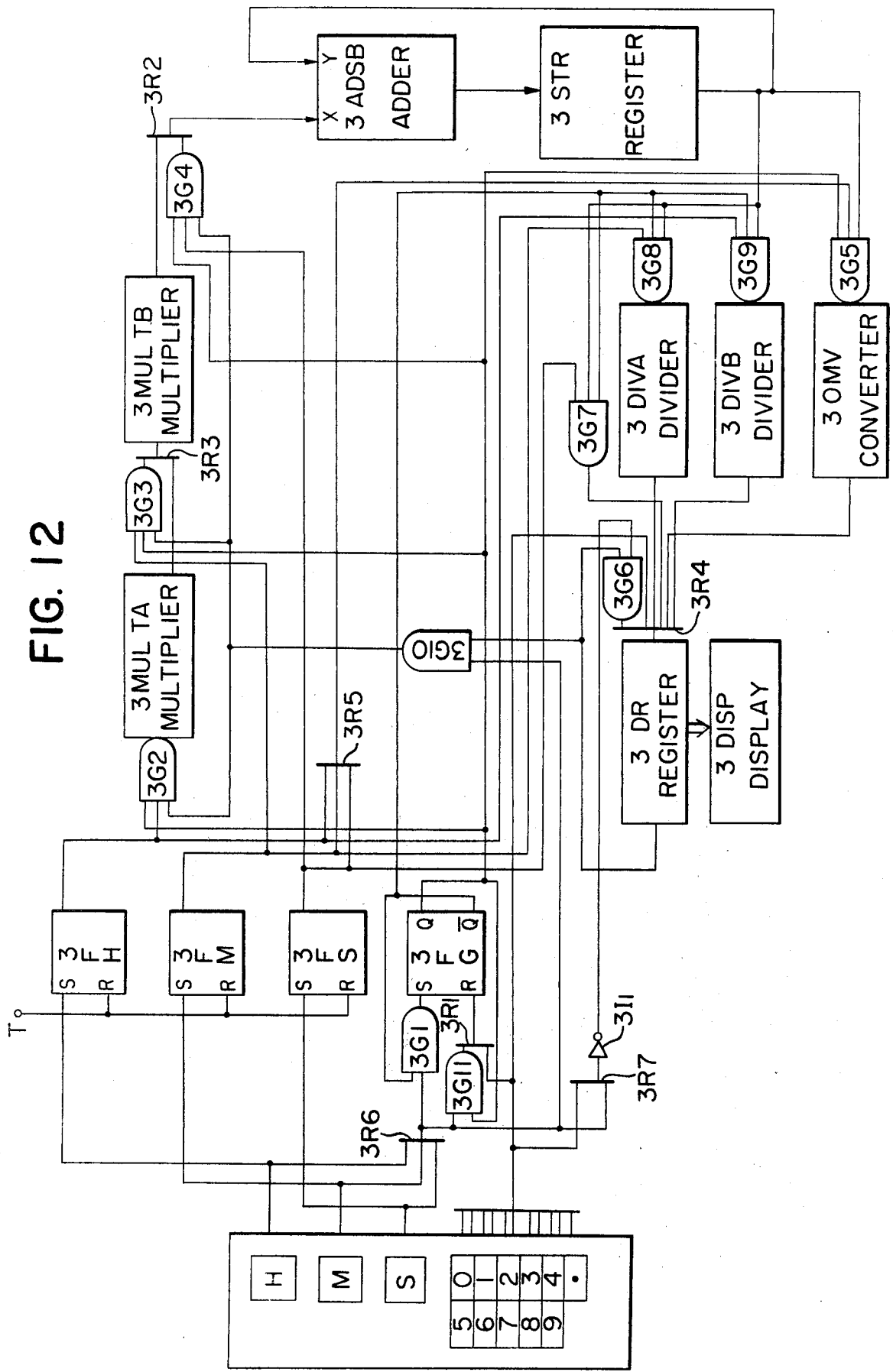
FIG. 12 is a block diagram of a fourth embodiment of the present invention.

Upon depressions of the keys "2", "5", ".", "5" and "S", "45025.5" is stored in the register 2STR as shown at d in FIG. 11 and 12 hours 30 minutes 25.5 seconds is displayed.

Next step is to add "36" minutes.

Upon depressions of the keys "3", "6", "M", "47185.5" is accumulated in the register 2STR whereas "13 hours 6 minutes 25.5 seconds", in the register 2DR and is displayed by the display unit 2DISP.

The next step is to subtract "1.23" hours.

Upon depression of "1", ".", "2", "3", "SC", "1.23" is stored in the register 2DR. Since the flip-flop 2FSC has been in the reset state, it is set in response to the depression of the key "SC" and the negative sign or symbol is displayed by the display unit 2DISP. Upon depression of the key H, the content in the register 2DR is converted into a number in second; that is, "4428", which in turn is applied to the adder 2ADSB. Since the flip-flop 2FSC is set, the subtraction is executed; that is, "4428" is subtracted from "47185.5" and the result "42757.5" is stored in the register 2STR and is converted by the converter 2COMV into "12 hours 9 minutes 17.5 seconds", which in turn is transferred to the register 2DR and displayed. Thereafter the flip-flop 2FSC is reset in response to the result "0" of the logical AND by AND gate 2G11 between the output "0" from 2STRS and the output "1" from 2FG.

So far the third preferred embodiment been described in conjunction with the addition and subtraction of time data, it will be understood that as with the case of the first and second embodiments, the third embodiment may be equally applied to the input and operations of other measurements of weights and lengths and systems. Since there are provided means for identifying the radices or units for the numeric data and means for executing the arithmetic operations of the numeric data in different radices or units in a common radix or unit, the operations of an electronic equipment incorporating the third embodiment may be much facilitated.

FOURTH EMBODIMENT, FIGS. 12 AND 13

In FIG. 12 there is shown in block diagram a fourth embodiment of the present invention having numeral keys 0–9, a decimal-point key and hour, minute and second keys H, M and S, other extra keys such as functional keys being added if needed.

3DR is a display register; 3STR, a "Second" storage register; 3DISP, a display unit for displaying the content of the register 3DR; 3MULTA, a first multiplier for multiplying the content in the display register 3DR by 60; 3MULTB, a second multiplier for multiplying the content of the register 3DR or first multiplier 3MULT by 60, the first and second multipliers converting the numbers in hour and minute units into number expressed in second as in the case of the second and third embodiment described in detail above; 3COMV, a converter for converting the content expressed in second unit in the register 3STR into a number expressed in hour, minute and second unit; 3ADSB, an adder for executing an addition or subtraction between the contents in the registers 3STR and 3DR; X and Y, input terminals; 3DIVA, a first divider for dividing the content in the register 3STR by 60; 3DIVB, a second divider for dividing the content in the register 3STR by 3600; 3G1, AND gate for setting a flip-flop 3FG; 3G2, AND gate for transferring the content of the register 3DR into the first multiplier 3MULTA when the flip-flops 3FH and 3FG are set; 3G3, AND gate for transferring the content in the register 3DR to the second multiplier 3MULTB when the flip-flops 3FM and 3FG are set; 3G4, AND gate for transferring the content of the register 3DR to OR gate 3R3 when flip-flops 3FG and 3FS are set; 3G5, AND gate for transferring the content of the register 3STR to the converter 3COMV when the flip-flop 3FG is set; 3G6, AND gate for holding the content in the register 3DR when no key is depressed; 3G7, AND gate for transferring the content of the register 3STR into OR gate 3R3 when the flip-flop 3FS is set while the flip-flop 3FG is reset; 3G8, AND gate for transmitting the content of the register 3STR to the first divider 3DIVA when the flip-flop 3FM is set while the flip-flop 3FG is reset; 3G9, AND gate for applying an input to the second divider 3DIVB when the flip-flop 3FH is set while the flip-flop 3FG is reset; 3G10, AND gate for applying the content in the display register 3DR to AND gates 3G2, 3G3 and 3G4 upon depression of either of the hour, minute or second key H, M or S; 3G11, AND gate for applying the set output signal from the flip-flop 3FG to OR gate 3R1 when either of the hour, minute or second key H, M or S is depressed; 3R1, OR gate for applying the output signal from the AND gate 3G11 and the input signal generated when one of the numeral keys is depressed to a reset terminal of the flip-flop 3FG; 3R2, OR gate for applying the outputs from the second multiplier 3MULTB and OR gate 3R4 to the X input of the adder 3ADSB; 3R3, OR gate for applying the outputs from the first multiplier 3MULTA and AND gate 3G3 to the second multiplier 3MULTB; 3R4, OR gate for applying to the display register 3DR the keyed-in signal and the outputs from AND gates 3G6 and 3G7, the first and second dividers 3DIVA and 3DIVB and the converter 3COMV; 3R5, OR gate for applying the outputs from the flip-flops 3FH, 3FM and 3FS to AND gate 3G5; 3R6; OR gate for applying the input signal generated when either of the hour, minute or second key H, M or S is depressed to OR gate 3R7 and to AND gates 3G1, 3G6, 3G10 and 3G11; 3R7, OR gate for applying to AND gate 3G6 through inverter 3I1 the output from OR gate 3R6 and the input signal generated upon depression of one of the numeral keys; T, a signal representative of the completion of an operation of numeric data entered with the depressions of the hour, minute and second keys H, M and S, the flip-flops 3FH, 3FM and 3FS being reset in response to the signal T.

Next the mode of operation of the fourth embodiment with the above construction will be described with further reference to FIG. 13 and in conjunction with the input of 12 H (hours) 36 M (minutes) 43.56 S (seconds).

Upon depression of the keys "1", "." and "2", the flip-flip 3FG is reset in response to the output signal from OR gate 3R1, and "1.2" is stored in the display register 3DR as shown at a in FIG. 13. Upon depression of the hour key "H", the flip-flops 3FH and 3FG are set, and the content in the register 3DR is transmitted through AND gates 3G10 and 3G2 to the first multiplier 3MULTA and is multiplied by 60, and the output from the first multiplier 3MULTA is transmitted through OR gate 3R3 to the second multiplier 3MULTB to be multiplied further by 60. The result "43200" is added by the adder 3ADSB to the content (which is zero at this step) of the register 3STR, and the sum "43200" is accumulated in the register 3STR. The content in the register 3STR is transferred through AND gate 3G5 to the converter 3COMV, where it is converted into a number expressed in hour, minute and second unit, which in turn is transferred through OR gate 3R4 to the display register 3DR for display by the display device 3DISP. Thereafter in response to the signal T the flip-flop 3FH is reset. At this stage, the contents of the registers 3DR and 3STR are as shown in FIG. 13b.

Upon depression of the keys "3", "6" and "M", the content in the register 3DR is converted by the second multiplier 3MULTB into "2160" seconds, which is added to the content "43200" in the register 3STR by the adder 3ADSB. The sum "45360" in second unit is stored in the register 3STR and is further transferred to the converter 3COMV, where it is converted into "12 hours 36 minutes" which is transfered to the display register 3DR for display. Thereafter in response to the signal T the flip-flop 3FM is reset. The registers 3DR and 3STR have contents as shown in FIG. 13c.

Next upon depression of "4", "3", ".", "5", "6" and "S", "45403.56" is stored in the register 3STR while "12 hours 36 minutes 43.56 seconds" is stored in the register 3DR as shown in FIG. 13d.

In response to the depression of the key M, the flip-flop 3FM is set, and the flip-flop 3FG which has been set since the input of "43.56S" is reset in response to the signal from AND gate 3G11 through OR gate 3R1. The content "45403.56" (in second unit) in the register 3STR is applied through AND gate 3G8 to the first divider 3DIVA and is divided by 60, and the result "756.726" is transferred through OR gate 3R4 to the display register 3DR for display. Thereafter in response to the signal T the flip-flop 3FM is reset and thus the operation is completed.

So far the fourth preferred embodiment has been described in conjunction with the conversion of a number expressed in hour, minute and second unit into a number expressed in minute, but it will be understood that when the second key S is depressed after the input of a time data in hour, minute and second unit, the content in the register 3STR is transferred through AND gate 3G7 to the register 3DR so that the input time data may be expressed in second unit. In like manner, upon depression of the hour key H, a time data may be expressed in hour unit. The fourth preferred embodiment has been so far described in conjunction with the input and conversion of a time data or sexagesimal number, but as with the case of the first to third embodiments it may be equally applied to the input and conversion of numbers in other measurements of weights and lengths and unit systems.

In summary, the fourth preferred embodiment has the advantage in that the input and radix or unit conversion of numeric data may be much simplified.

FIFTH EMBODIMENT, FIGS. 14–17

Next referring to FIGS. 14–17 a fifth preferred embodiment of the present invention will be described, and first referring particularly to FIG. 14 the construction thereof will be described in detail below.

Figure 14:
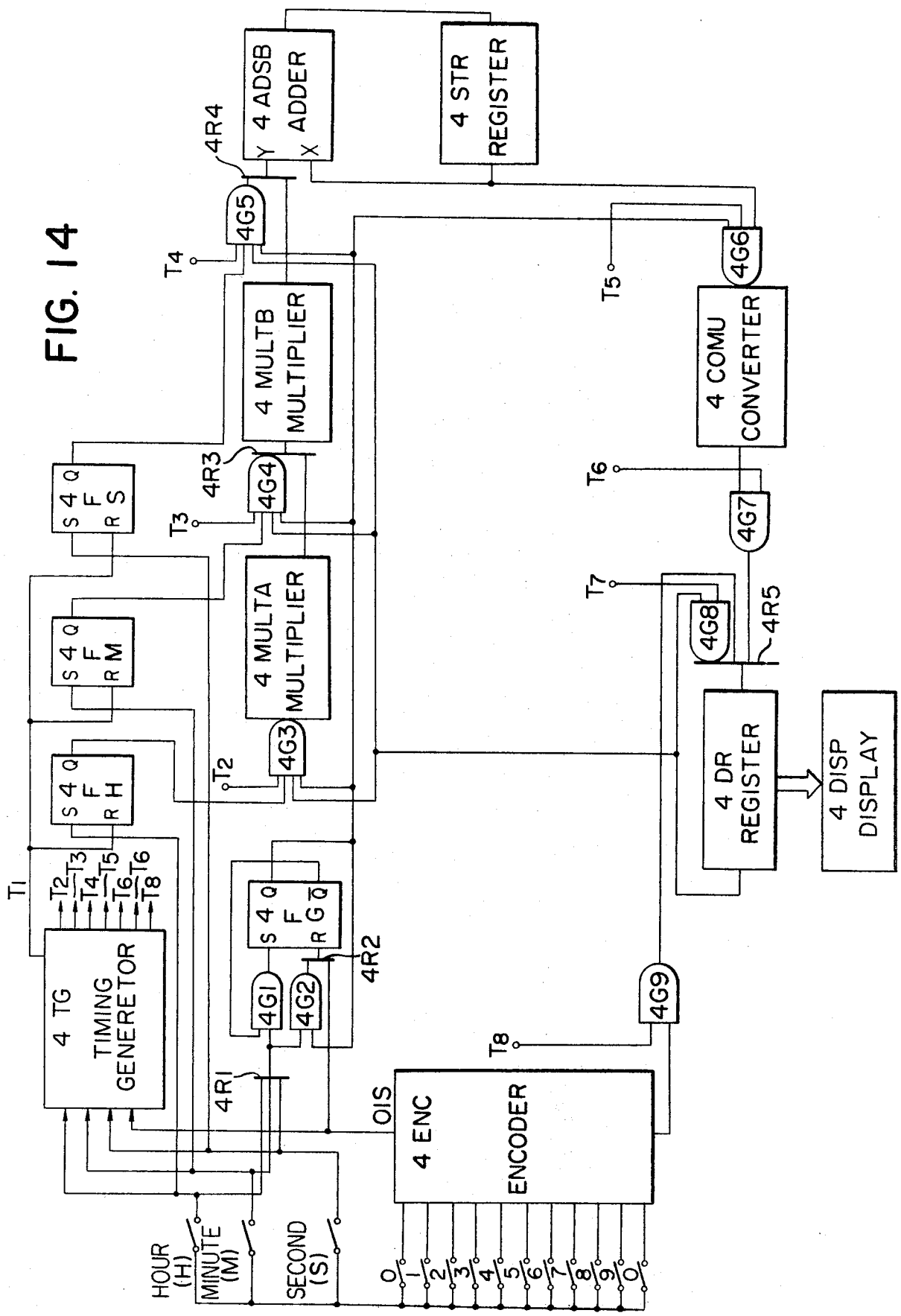
FIG. 14 is a block diagram of a fifth preferred embodiment of the present invention.

In a block diagram shown in FIG. 14, 4DR is a display register; 4STR, "Second" storage register; 4DISP, a display unit for displaying the content in the display register 4DR; 4MULTA, a first multiplier for multiplying by 60 the content in the display register 4DR; 4MULTB, a second multiplier for multiplying the content in the register 4DR or the output from the first multiplier 4MULTB by 60, the first and second multipliers converting a time data in hour, minute and second unit into a number expressed in second unit.

4COMU is a converter for converting the content expressed in second unit in the register 4STR into a number expressed in hour, minute and second unit; 4ADSB, an adder for executing an addition or subtraction between the contents in the registers 4STR and 4DR; X and Y, inputs of the adder 4ADSB; 4FG, a flip-flop for identifying that a number being displayed is in the hour, minute and second system; 4FH, 4FM and 4FS, flip-flops for identifying the depression of the hour, minute and second keys H, M and S; 4G1, AND gate for setting the flip-flop 4FG upon depression of either of the hour, minute or second key H, M or S; 4G2, AND gate for resetting the flip-flop 4FG upon depression of either of the hour, minute or second key H, M or S; 4G3, AND gate for applying the content in the register 4DR to the first multiplier 4MULTA at a time T2 when the flip-flops 4FH and 4FG are set; 4G4, AND gate for transferring the content in the register 4DR in response to the timing signal T3 to OR gate 4R3 when the flip-flops 4FM and 4FG are set; 4G5, AND gate responsive to a timing signal T4 for transferring the content of the register 4DR to OR gate 4R4 when the flip-flops 4FS and 4FG are set; 4G6, AND gate responsive to a timing signal T5 for applying the content in the register 4STR to the converter 4COMU when the flip-flop 4FH is set; 4G7, AND gate responsive to a timing signal T6 for transferring the content in the converter 4COMU to OR gate 4R5; 4G8, AND gate for transferring the content of the register 4DR to OR gate 4R5 in response to a timing pulse T7; 4G9, AND gate responsive to a timing signal T8 for transferring the content in a decoder DEC to OR gate 4R5; 4R1, OR gate for delivering the input signal generated upon depression of either of the key H, M or S to the inputs of AND gates 4G1 and 4G2; 4R2, OR gate for resetting the flip-flop 4FG when the output from the decoder DEC or AND gate 4G2 is "1"; 4R3, OR gate for applying to the second multiplier 4MULTB the content of the register derived through the first multiplier 4MULTA or OR gate 4R4; 4R4, OR gate for applying the output from the second multiplier 4MULTB and the content in the register 4DR through AND gate 4G5 to the Y input of the adder 4ADSB; 4R5, OR gate for applying the outputs from AND gates 4G7, 4G7 and 4G9 to the display register 4DR; 4ENC, an encoder for encoding an input signal by the depression of one of the numeral keys 0–9, the encoder having a one-shot signal generator responsive to the keying-in of the numeral key for generating a one-shot signal OS, to response to which the flip-flop 4FG is reset and a timing generator generates timing signals; 4TG, the timing generator for generating the timing signals T1–T8 (See FIG. 16) in response to the depression of the keys H, M and S and the one-shot signal OS.

Next the mode of operation of the fifth preferred embodiment with the above construction will be described with further reference to FIGS. 15, 16 and 17 and in conjunction with the input of 1 hour 136 minutes and 56 seconds.

First upon depression of the numeral key "1", the one shot signal OS is generated to reset the flip-flop 4FG, and the timing generator 4TG generates the timing signal T8 as shown at a in FIG. 16 so that the coded signal representative of "1" is entered through AND gate 4G9 and OR gate 4R5 into the display register 4DR as shown in FIG. 15a.

Next upon depression of the hour key "H", the $\overline{Q}$ output signal from the flip-flop 4FG is "1", so that in response to the output from OR gate 4R1, AND gate 4G1 delivers the output signal in response to which the flip-flops 4FG and 4FH are set. Next in response to the timing signal T2 shown at b in FIG. 16, the content in the display register 4DR is transferred through AND gate 4G3 to the first multiplier 4MULTA, where it is multiplied by 60, and the result is transmitted through OR gate 4R4 to the second multiplier 4MULTB to be multiplied further by 60. The result "3600" is applied through OR gate 4R4 to the input terminal Y of the adder 4ADSB. Since the content in the register 4STR is zero, the output from the adder 4ADSB is "3600", which is stored in the register 4STR and is transferred in response to the timing signal T5 to the converter 4COMU through AND gate 4G6 so that "3600" expressed in second unit is converted into "1" expressed in hour unit. In response to the timing pulse T6, "1" is transferred through AND gate 4G7 and OR gate 4R5 to the register 4DR as shown at b in FIG. 15. Thereafter in response to the timing signal T1 the flip-flop 4FH is reset.

Figures 16A, 16B, 16C, 16D:
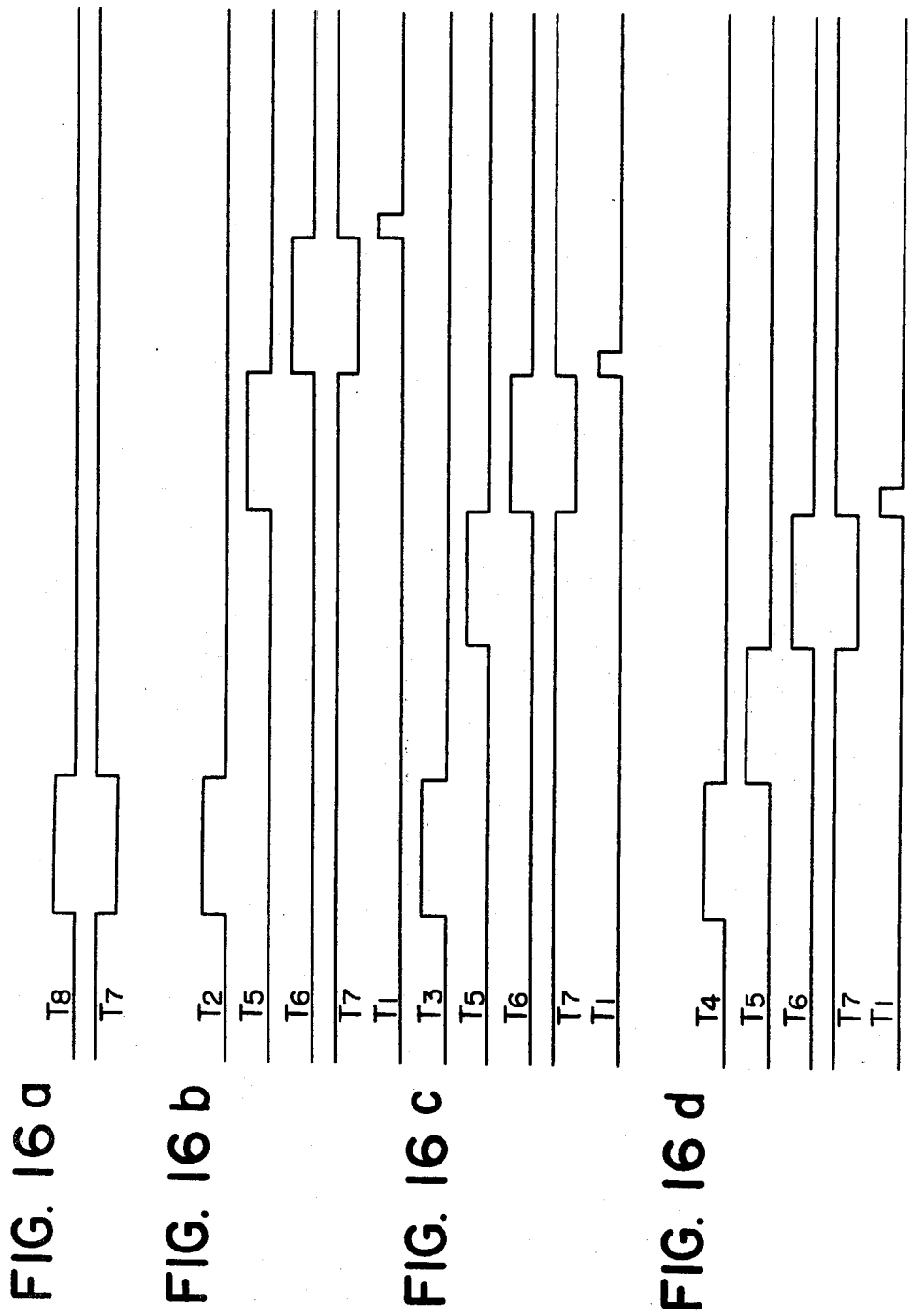

Upon the input of "136M", the flip-flops 4FG and 4FM are set in a manner substantially similar to that described above, and the content "136" in the display register 4DR is transferred in response to the timing signal T3 to the second multiplier 4MULTB through AND gate 4G4 and OR gate 4R3 and is converted into "8160" expressed in second unit. The result is applied through OR gate 4R4 to the Y input of the adder 4ADSB and is added to the content "3600" in the register 4STR, and the sum "11760" is stored in the register 4STR. In response to the timing signal T5, the content in the register 4STR is applied to the converter 4COMU to be converted into 3 hours 16 minutes, which in turn is transferred in response to the timing signal T6 to the display register 4DR through AND gate 4G7 and OR gate 4R5 and is displayed. Thereafter, in response to the timing signal T1 the flip-flop 4FM is reset. Thus the contents of the registers 4DR and 4STR are as shown in FIG. 15c. The timing signals T generated in the step of input of 16 minutes are shown in FIG. 16c.

Next upon depression of the keys "5", "6" and "S", the flip-flops 4FG and 4FS are set, and in response to the timing signal T4 the content "56" stored in the display register 4DR is applied to the Y input of the adder 4ADSB through OR gates 4R5 and 4R4 and is added to the content "11760" in the register 4STR. The sum "11816" is stored in the register 4STR, and in response to the timing signal T5 it is applied to the converter 4COMU through AND gate 4G6 to be converted into 3 hours 16 minutes 56 seconds. This is transferred in response to the timing signal T6 to the register 4DR through AND gate 4G7 and OR gate 4R5 and is displayed. Thereafter in response to the timing signal T1 the flip-flops 4FS is reset so that the input of the number expressed in second unit is completed. The timing signals used in the input of the number in second unit are shown in FIG. 16d whereas the registers 4DR and 4STR have contents as shown in FIG. 15d.

So far the time data has been described as being entered in the order of hour, minute and second, but it will be understood that it may be entered in any desired orders will be described in detail below.

It is assumed that 5 H (hour) 35 seconds be entered. The number 35 expressed in second unit may be entered first. That is, upon depression of the numeral keys "3" and "5", "35" is stored in the register 4DR in a manner substantially similar to that described above. Upon depression of the second key "S", the flip-flops 4FG and 4FS are set and in response to the timing signal T4 the content in the display register 4DR is transferred through AND gate 4G5 to the adder 4ADSB and the sum "35" is entered into the register 4STR.

In response to the timing signal T5 from the timing generator 4TB, the content "35" in the register 4STR is applied to the converter 4COMU to be converted into a number expressed in second unit and displayed as shown at b in FIG. 17.

Next the data "5" is entered into the display register 4DR, and in response to the depression of the hour key "H", the content "5" in the display register 4DR is applied to the first multiplier 4MULTA and the result is further applied to the second multiplier 4MULTB. The result "18000" is added by the adder 4ADSB to the content in the register 4STR and the result or sum is stored therein.

In response to the timing signal from the timing generator 4TG the content in the register 4STR is applied to the converter 4COMV to be converted into a number expressed in hour, minute and second unit, which in turn is transferred to the display register 4DR for display as shown in FIG. 17d.

The converter 4COMV first divides by a divisor "3600" the dividend transferred from the "Second" storage register 4STR, and then divides the remainder by "60", the remainder from this division being expressed in second unit. In order to edit the output from the converter, a parallel-serial register is provided in which the least significant and next least significant positions are assinged as positions for a number expressed in second unit; the next two digit positions, as the positions of a number expressed in minute unit; and the higher significant positions above the fourth position, as positions for entering a number expressed in hour unit. Therefore the quotient of the division by 3600 is entered into the hour digit positions, and the quotient of the division of the remainder by 60 is entered into the minute digit positions and the remainder, in the second digit positions. The contents in the parallel-serial register are transferred to the display register 4DR for display.

As described above, according to the fifth preferred embodiment of the present invention, numbers in different radices or units may be enerted in any desired order or significance into the parallel-serial register, which may be incorporated in the register 4DR.

The fifth preferred embodiment has been so far described also in conjunction with the input of a time data, but it will be understood that as with the other preferred embodiments described it may be equally applied to the input of numeric data expressed in other measurements of weights and lengths and unit systems.

In summary, the fifth embodiment of the present invention provides means for identifying units or radices of numeric data entered and converting them in to a number expressed in any desired radix or unit so that arithmetic operations may be much facilitated.

SIXTH EMBODIMENT, FIGS. 18–20

Figure 18:
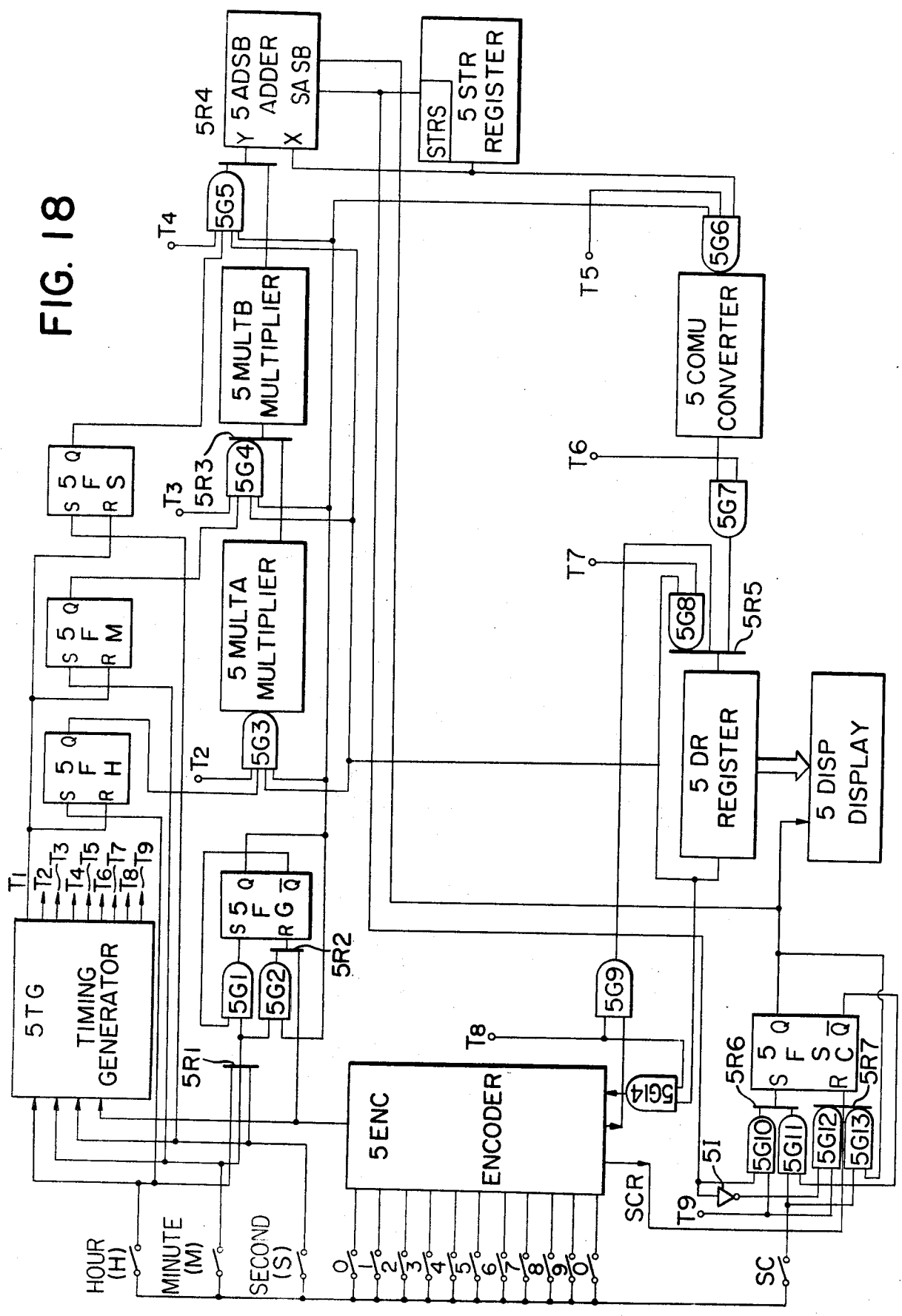
FIG. 18 is a block diagram of a sixth preferred embodiment of the present invention.

Next referring to FIGS. 18–20, the sixth preferred embodiment of the present invention will be described. First referring to FIG. 18, 5DR is a display register; 5STR, a "Second" storage register; 5STRS, a part of the register 5STR for storing the sign of the content therein; 5DISP, a display unit for displaying the content in the register 5DR; 5MULTA, a first multiplier for multiplying by 60 the content in the display register 5DR; 5MULTB, a second multiplier for multiplying by 60 the output from the first multiplier 5MULTA or the content in the display register 5DR, the first and second multipliers converting a number expressed in hour and/or minute into a number expressed in second unit as with the case of the second to fifth embodiments; 5ADSB, an adder for executing an addition or subtraction of the contents in the register 5DR and 5STR in response to the output from a detector 5SA or 5SB which detects the outputs from the sign storage register 5STRS and a flip-flop 5FSC; X and Y, input terminals; 5ENC, an encoder for coding an input signal keyed in by the depression of one of numeral keys, the encoder including a control unit for controlling the display register 5DR, a one-shot signal generator for generating a one-shot signal OS in response to the depression of the numeral key, and another signal generator for generating a signal SCR in response to the depression of the numeral key after the depression of the first numeral key and the hour, minute and second keys H, M and S, the signal SCR causing the flip-flop 5FSC to reset while the signal OS causing the flip-flop 5FG to reset and the timing generator 5TG to generate timing signals (See FIG. 20); 5TG, the timing generator for generating the timing signals T1–T9 in response to the depression of either of the hour, minute or second key H, M or S and the one-shot signal OS; 5FG, a flip-flop for identifying that the number being displayed is in the hour, minute and second system; 5FH, 5FM and 5FS, flip-flops for the identification of the depression of the hour, minute and second keys H, M and S, respectively; 5FSC, the flip-flop for identifying that the content in the display register 5DR is a negative number; 5G1, AND gate for setting the flip-flop 5FG in response to the depression of either of the key H, M or S; 5G2, AND gate for resetting the flip-flop 5FG upon depression of the key H, M or S; 5G3, AND gate responsive to the timing signal T2 for transferring the content of the register 5DR to the first multiplier 5MULTA when both the flip-flops 5FH and 5FG are set; 5G4, AND gate for transferring the content of the register 5DR to OR gate 5R3 in response to the timing signal T3 when both the flip-flops 5FM and 5FG are set; 5G5, AND gate for transferring the content in the display register 5DR to OR gate 5R4 when the flip-flops 5FS and 5FH are set in response to the timing signal T4; 5G6, AND gate for transferring the content in the register 5STR to the converter 5COMV in response to the timing signal T5 when the flip-flop 5FH is set; 5G7, AND gate responsive to the timing signal T6 for transferring the content of the converter 5COMV to OR gate 5R5; 5G8 AND gate responsive to the timing signal T7 for transferring the content in the display register 5DR to OR gate 5R5; 5G9, AND gate responsive to the timing signal T8 for transferring the convent in the decoder 5DEC to OR gate 5R5; 5R1, OR gate for delivering, in response to the depression of either of the key H, M or S, an output signal to AND gates 5G1 and 5G2; 5R2, OR gate for resetting the flip-flop 5FG when the output from either of the decoder 5DEC or AND gate 5G2 is "1"; 5R3, OR gate for applying to the second multiplier 5MULTB the output from the first multiplier 5MULTA or AND gate 5G4; 5R4, OR gate for applying to the Y input of the adder 5ADSB the output from the second multiplier 5MULTB or the content derived from the register 5DR through AND gate 5G5; 5R5, OR gate for applying the outputs from AND gates 5G7, 5G8 and 5G9 to the register 5DR, OR gate 5R6 delivering a signal to the flip-flop 5FSC to set in response to the output from AND gate 5G10; 5R7, OR gate for resetting the flip-flop 5FSC when AND GATES 5G12 and 5G13 and the encoder 5ENC deliver the output signals, the signal from the encoder being SCR; 5G10, AND gate responsive to the timing signal T9 and the signal "1" from the register 5STRS for setting the flip-flop 5FSC; 5G11, AND gate responsive to the Q output signal "1" from the flip-flop 5FSC and the depression of the change-sign key SC for delivering the output signal through OR gate 5R6 to set the flip-flop 5FSC; 5G12, AND gate responsive to the timing signal T9 and the output signal "0" from the register 5STRS for delivering the output signal through OR gate 5R7 to the flip-flop 5FSC to reset it; 5G13, AND key responsive to the Q output signal "1" from the flip-flop 5FSC and the depression of the key SC for delivering the signal through OR gate 5R7 to the flip-flop 5FSC to reset it; 5I, an inverter.

Next the mode of operation of the sixth embodiment with the above construction will be described with further reference to FIGS. 19 and 20 and in conjunction with a sequence of arithmetic operations of subtracting 15 minutes from 12 hours and adding 36 seconds.

First upon depression of the numeral keys "1" and "2", the one-shot signal OS is generated to reset the flip-flop 5FG and to cause the timing generator 5TG to generate the timing signal T8 so that the numeric data "12" is entered through AND gate 5G9 and OR gate 5R5 into the register 5DR as shown at a in FIG. 19 in response to the timing signal T7 shown in FIG. 20a.

Upon depression of the hour key "H", in response to the Q output signal "1" from the flip-flop 5FG and the output signal from OR gate 5R1, AND gate 5G1 delivers the output signal to the flip-flops 5FG and 5FH to set them. In response to the timing signal T2 shown in FIG. 20b, the content in the register 5DR is applied through AND gate 5G3 to the first multiplier 5MULTA, and the output from it is applied through OR gate 5R3 to the second multiplier 5MULTB so that 12 hours is converted into 4320 seconds. The latter is applied through OR gate 5R4 to the Y input of the adder 5ADSB. Since the content in the register 5STR is zero and both the outputs from the register 5STRS and the Q output terminal of the flip-flop 5FSC are "Os", "43200" is stored in the register 5STR. In response to the next timing signal T5 the content in the register 5STR is transferred through AND gate 5G6 to the converter 5COMV, where it is converted back to 12 hours. In response to the timing signal T6, it is transferred through AND gate 5G7 and OR gate 5R5 to the display register 5DR. In response to the "0" signal from the register 5STRS transmitted through AND gate 5G12 and OR gate 5R7, the flip-flop 5FSC is kept in the reset state.

In response to the timing signal T1 the flip-flop 5FH is reset. Thus the operation of entering the input 12 hours is completed. The timing signals are shown in FIG. 20b and the contents in the registers 5DR and 5STR and the conditions of the flip-flops 5FG and 5FCS are shown in FIG. 19b.

Upon depression of the keys "1", "5", "SC" and "M", the time data 15 minutes before may be entered. That is, in response to the timing signals T7 and T8, the number "15" is entered into the register 5DR and the flip-flop 5FG is reset. In response to the depression of the key SC and the Q output signal "1" from the flip-flop 5FSC through AND gate 5G11 and OR gate 5R6 the flip-flop 5FSC is set. The timing signals are shown in FIG. 20c and the contents of the registers 5DR and 5STR and the conditions of the flip-flops 5FG and 5FSC, in FIG. 19c.

Next upon depression of the minute key M, the flip-flops 5FG and 5FM are set, and in response to the next timing signal T3 the content "15" in the register 5DR is applied through AND gate 5G4 and OR gate 5R3 to the second multiplier 5MULTB to be converted in second unit. The result "900" (in second unit) is applied to the Y input of the adder 5ADSB through OR gate 5R4. In response to the signal "1" from the flip-flop 5FSC applied to the detector 5SB, the result "900" is subtracted from the content "43200" in the register STR, and the result "42300" is stored in the register 5STR. In response to the timing signal T5 the content "42300" in the register STR is transferred through AND gate 5G to the converter 5COMV to be converted into 11 hours 45 minutes. In response to the timing signal T6 the output "11 hours 45 minutes" is transferred through AND gate 5G7 and OR gate 5R5 to the register 5DR for display. In response to the signal "0" from the register 5STRS and the timing signal T9 AND gate 5G12 delivers through OR gate 5R7 the output signal to the flip-flop 5FSC to reset it. In response to the next timing signal T1, the flip-flop 5FM is reset, and thus the operation of entering "15" minutes and subtracting it from "12" hours is completed. The timing signals are shown in FIG. 20d and the contents in the registers 5DR and 5STR and the conditions of the flip-flops 5FH and 5FSC, in FIG. 19d.

Next the keys are depressed in the order of "3", "6" and "S" so that the flip-flops 5FG and 5FS are reset in a manner substantially similar to that described above, and in response to the timing signal T4 the content "36" in the register 5DR is added to the content in the register 5STR and the sum "423336" is stored in the register 5STR. In response to the next timing signal T5, the content "42336" in the register 5STR is converted into 11 hours 45 minutes 36 seconds which in turn is transferred in response to the next timing signal T6 to the display register 5DR. In response to the timing signal T1 the flip-flops 5FSC and 5FS are reset. The timing signals are shown in FIG. 20e and the contents in the registers 5DR and 5STR and the conditions of the flip-flops 5FG and 5FSC, in FIG. 19e.

In summary, according to the sixth embodiment, units or radices of numeric data entered may be identified by the depression of keys H, M and S and their sign, by the depression of the sign-change key SC. That is, a negative time data in hour, minute and second unit may be easily entered into a computer. Furthermore when the functional keys are provided, the arithmetic operations between the time data may be executed in a very simple manner. It is to be understood that the sixth preferred embodiment may be equally applied to the input of numbers in other measurements of weights and lengths and unit systems.

What is claimed is:

1. An electronic data processing device comprising:
input means for entering numerical data into storage means;
specifying means for specifying units of the numerical data entered by said input means;
identifying means for identifying sequential operations of said specifying means, said identifying means producing a first level of signal responsive to a first operation of said specifying means, and producing a second level of signal responsive to a second operation of said specifying means;
conversion means for converting a numerical data format of the data stored in said storage means to another data format; and
control means responsive to said signals from said identifying means for causing said conversion means to convert a first numerical data format of the entered numerical data having units specified by said specifying means, into a second numerical data format having a plurality of units when said control means receives said first level signal from said identifying means, and for said conversion means to reconvert said second numerical data format into said first numerical data format when said control means receives the second level of signal from said identifying means.

2. An electronic data processing device according to claim 1 wherein said identifying means comprises a counter for counting the operations of said specifying means.

3. An electronic data processing device according to claim 1 wherein said control means causes said conversion means to convert the first numerical data entered as decimal numbers into the second numerical data represented by a scale of 60 numbers when said control means receives said first level of signal from said identifying means, and causes said conversion means to reconvert the second numerical data represented by a scale of 60 numbers into the first numerical data represented by decimal numbers when said control means receives said second level of signal from said identifying means.

4. An electronic data processing device according to claim 1 wherein said specifying means includes a plurality of specifying keys each of which specifies a different unit.

5. An electronic data processing device according to claim 1 further comprising an additional conversion means for converting the entered numerical data having units specified by said specifying means into a numerical data given by a predetermined reference unit.

6. An electronic data processing device according to claim 5 wherein said control means causes said conversion means to convert the first numerical data entered as a decimal number into a second numerical data represented by a scale of 60 numbers when said control means receives said first level of signal from said identifying means, and causes said conversion means to reconvert the second numerical data represented by a scale of 60 numbers into the first numerical data represented by a decimal number when said control means receives said second level of signal from said identifying means.

7. An electronic data processing device according to claim 1 wherein said identifying means further comprises a memory for memorizing the operations of said specifying means.

8. An electronic data processing device according to claim 7 wherein said memory comprises a one bit binary logic circuit.

9. An electronic data processing device according to claim 7 wherein said control means causes said conversion means to convert the first numerical data entered as a decimal number into the second numerical data represented by a scale of 60 numbers when said control means receives said first level of signal from said identifying means, and causes said conversion means to reconvert the second numerical data represented by a scale of 60 numbers into the first numerical data represented by a decimal number when said control means receives said second level of signal from said identifying means.

10. An electronic data processing device comprising:
input means having numerical keys for entering numerical data;
first storage means for storing the numerical data entered from said numerical keys;
a plurality of unit specifying keys for specifying units of the numerical data stored in said first storage means, each of the keys specifying a different unit;
first conversion means for converting a numerical data format of the data stored in said first storage means and specified by a selected one of said unit specifying keys into other data format corresponding to a predetermined first reference unit;
arithmetic operation means for carrying out the arithmetic operations with respect to data entered by said input means, said arithmetic operation means having a first input terminal to which the converted data is applied from said first conversion means, and having a second input terminal and an output terminal;
second storage means having an input coupled to said output terminal provided by said arithmetic operation means, said second storage means having an output connected to the second input terminal of said arithmetic operation means;
first control means responsive to the operation of any one of said unit specifying keys for causing said arithmetic operation means to carry out the arithmetic operation between the data applied to the first input terminal and the data applied to the second input terminal thereof, so that a new operation resultant is stored in said second storage means upon every operation of any one of said unit specifying keys following the entry of new numerical data;
identifying means for identifying the sequential operation of said specifying keys and for producing an output signal;
second conversion means for converting a numerical data format of the data stored in said second storage means into another data format;
second control means responsive to the output signal from said identifying means for causing said second conversion means to convert the numerical data format of the data stored in said second storage into the said other data format given by a second reference unit or a third reference unit; and
visualizing means for displaying the converted data in said second conversion means.

11. An electronic data processing device according to claim 10 wherein said unit specifying keys include a "second" key for specifying a time unit in seconds.

12. An electronic data processing device according to claim 10 wherein said unit specifying keys include a "minute" key for specifying a time unit in minutes.

13. An electronic data processing device according to claim 10 wherein said unit specifying keys include an "hour" key for specifying a time unit in hours.

14. An electronic apparatus comprising:
input means having numerical keys for entering numerical data;
first storage means for storing the numerical data entered from said numerical keys;
a plurality of unit specifying keys for specifying units of the numerical data stored in said first storage means, each of the keys specifying a different unit;
second storage means having a plurality of storage locations associated respectively with said plurality of unit specifying keys;
control means responsive to the operation of said unit specifying keys for controlling a transfer of the data from said first storage means to said second storage means, wherein said transferred data is stored in storage locations of said second storage means associated with the operated one of said unit specifying keys;
visualizing means for displaying the numerical data; and
display control means for controlling the actuation of said visualizing means to apply the numerical data stored in said first storage means to said visualizing means when any one of said numerical keys is operated, and to apply the numerical data stored in said second storage means to said visualizing means when one of said unit specifying keys is operated so that said visualizing means displays the numerical data of said second storage means at the digit positions thereof associated with the storage location of said second storage means.

15. An electronic apparatus according to claim 14 wherein said unit specifying keys include an "hour" key, a "minute" key, and a "second" key.

16. An electronic apparatus according to claim 15 wherein said numerical keys comprise one set of decimal number keys.

17. An electronic apparatus comprising:
input means having numerical keys for entering numerical data;
first storage means for storing the numerical data entered by said numerical keys;

units specifying means for specifying units of the numerical data stored in said first storage means;

second storage means having a plurality of storage locations associated respectively with each of the units to be specified by said units specifying means;

control means responsive to the operation of said units specifying means for controlling a transfer of the data from said first storage means to said second storage means, wherein said transferred data is stored in storage locations of said second storage means associated with the unit specified by said units specifying means;

visualizing means for displaying the numerical data; and display control means for controlling the display actuation of said visualizing means to apply the numerical data stored in said first storage means to said visualizing means when any one of said numerical keys is operated, and to apply the numerical data stored in said second storage means to said visualizing means when said units specifying means is operated so that visualizing means displays the numerical data of said second storage means at the digit positions thereof associated with the storage location of said second storage means.

18. An electronic data processing device comprising:

input means for entering numerical data into storage means;

specifying means for specifying units of the numerical data entered by said input means;

identifying means for identifying sequential operations of said specifying means, said identifying means producing a first level of signal responsive to a first operation of said specifying means, and producing a second level of signal responsive to a second operation of said specifying means;

conversion means for converting a numerical data format of the data stored in said storage means to another data format; and control means responsive to the output signals from said identifying means for causing said conversion means to convert a first numerical data format of the entered numerical data having a unit specified by said specifying means into a second numerical data format having a plurality of units when said control means receives the second level of signal from said identifying means.

* * * * *

UNITED STATES PATENT OFFICE
CERTIFICATE OF CORRECTION

Patent No. 4,134,536            Dated 01/16/79

Inventor(s) SEIJI SAITO, ET AL

It is certified that error appears in the above-identified patent and that said Letters Patent are hereby corrected as shown below:

Column 1, Line 54, after "36" delete ";1";

Column 6, Line 30, change "fro" to read --from--;

Column 6, Line 30, after "gates" insert a space

Column 8, Line 15, change "flip-flops" to read --flip-flop--

Column 13, Line 1, insert before "derived" --4DR--;

Column 16, Line 39, change "Q" to read --$\bar{Q}$--.

Signed and Sealed this

First Day of May 1979

[SEAL]

Attest:

RUTH C. MASON
*Attesting Officer*

DONALD W. BANNER
*Commissioner of Patents and Trademarks*